US012756403B2

(12) United States Patent
Verbruggen et al.

(10) Patent No.: US 12,756,403 B2
(45) Date of Patent: Oct. 6, 2026

(54) UNIT CELL CIRCUITRY OF DIGITAL-TO-ANALOG CONVERTER CIRCUITRY HAVING CHARGE INJECTION

(71) Applicant: XILINX, INC., San Jose, CA (US)

(72) Inventors: Bob Walter Verbruggen, Hørsholm (DK); Christophe Erdmann, Cannes (FR)

(73) Assignee: XILINX, INC., San Jose, CA (US)

( * ) Notice: Subject to any disclaimer, the term of this patent is extended or adjusted under 35 U.S.C. 154(b) by 127 days.

(21) Appl. No.: 18/943,582

(22) Filed: Nov. 11, 2024

(65) Prior Publication Data

US 2026/0135567 A1 May 14, 2026

(51) Int. Cl.
*H03M 1/80* (2006.01)
*H03M 1/66* (2006.01)

(52) U.S. Cl.
CPC ............. *H03M 1/802* (2013.01); *H03M 1/66* (2013.01)

(58) Field of Classification Search
CPC ................................ H03M 1/66; H03M 1/802
USPC .................................................. 341/144, 150
See application file for complete search history.

(56) References Cited

U.S. PATENT DOCUMENTS 7,629,910 B2 * 12/2009 Ramadoss ........... H03M 1/0881 341/144
8,441,382 B2 * 5/2013 Mahajan .............. H03K 17/063 341/144

* cited by examiner

*Primary Examiner* — Khai M Nguyen
(74) *Attorney, Agent, or Firm* — Patterson + Sheridan, LLP

(57) ABSTRACT

A unit cell circuitry for a digital-to-analog converter (DAC) circuitry includes cascode circuitry, switch circuitry, and capacitor circuitry. The cascode circuitry is connected to a first output node and a second output node of the unit cell circuitry. The switch circuitry is connected to the cascode circuitry. The capacitor circuitry includes one or more capacitors connected to the switch circuitry. The switch circuitry connects the capacitor circuitry to the cascode circuitry to inject a charge onto the cascode circuitry. The unit cell circuitry outputs a signal based on the injected charge.

20 Claims, 8 Drawing Sheets

UNIT CELL CIRCUITRY OF DIGITAL-TO-ANALOG CONVERTER CIRCUITRY HAVING CHARGE INJECTION

TECHNICAL FIELD

Examples of the present disclosure generally relate to mitigating noise and power consumption of unit cells for a digital-to-analog converter circuitry.

BACKGROUND

In various electronic systems, data is converted between digital and analog signal formats. For example, a digitally-encoded data stream may be transmitted as a digital signal and converted to an analog signal by digital-to-analog converter (DAC) circuitry for further processes. DACs may be used in a variety of applications. DACs are commonly used in music players for converting digital data streams into audio signals, along with televisions, mobile phones, and other wireless communication systems to convert digital data streams into analog signals.

Some wireless communication systems use a radio frequency (RF) DAC having one or more cells to convert a received digital signal to an analog signal for further filtering and processing. RF DACs are used within base stations of a wireless communication system. Commonly, RF DACs are implemented using a current steering architecture. In this architecture, a switch sends the current from a current source to one of two differential outputs. The current pulse in this architecture is rectangular. The rectangular pulse causes a sinc shaped frequency response of the RF DAC. The sinc shaped frequency response limits the 3 dB bandwidth of the DAC. Interleaving may be used to increase the data rate of the DAC. However, the amount of power that can be generated at high frequencies is limited by the current pulse width. The current pulse width is limited by how quickly a switch can be turned on (e.g., to start the current pulse) and turned off (e.g., to end the current pulse). Accordingly, interleaving is not usable within conventional current steering DACs as the clock rate and bandwidth are linked.

In a direct sampling capacitor DAC, data-driven capacitors are connected to the output to generate the signal. However, in a direct sampling capacitor DAC, the low-impedance node at the output requires a transformer to obtain 100 ohm differential matching at the output, and as the signal is essentially capacitively coupled, the direct sampling capacitor DAC is not able to generating DC signals.

Accordingly, there is a need for an improved DAC architecture that is able to interleave multiple DAC instances and process signals at higher frequencies.

SUMMARY

In one example, unit cell circuitry for a digital-to-analog converter (DAC) circuitry includes cascode circuitry, switch circuitry, and capacitor circuitry. The cascode circuitry is connected to a first output node and a second output node of the unit cell circuitry. The switch circuitry is connected to the cascode circuitry. The capacitor circuitry includes one or more capacitors connected to the switch circuitry. The switch circuitry connects the capacitor circuitry to the cascode circuitry to inject a charge onto the cascode circuitry. The unit cell circuitry outputs a signal based on the injected charge.

In one example, a digital-to-analog converter (DAC) circuitry includes unit cell circuitries that include outputs that are connected to a load. A first unit cell circuitry of the unit cell circuitries includes cascode circuitry, switch circuitry, and capacitor circuitry. The cascode circuitry is connected to a first output node and a second output node of the unit cell circuitry. The switch circuitry is connected to the cascode circuitry. The capacitor circuitry includes one or more capacitors connected to the switch circuitry. The switch circuitry connects the capacitor circuitry to the cascode circuitry to inject a charge onto the cascode circuitry. The unit cell circuitry outputs a signal based on the injected charge.

In one example, a computer system includes processing circuitry that processes a signal in an analog domain and digital-to-analog converter (DAC) circuitry having an output connected to the processing circuitry. The DAC circuitry converts an input signal from a digital domain to the analog domain. The DAC circuitry includes unit cell circuitry. The unit cell circuitry includes cascode circuitry, switch circuitry, and capacitor circuity. The cascode is connected to a first output node and a second output node of the unit cell circuitry. The switch circuitry is connected to the cascode circuitry. The capacitor circuitry includes one or more capacitors connected to the switch circuitry. The switch circuitry connects the capacitor circuitry to the cascode circuitry to inject a charge onto the cascode circuitry. The unit cell circuitry is configured to output a signal based on the injected charge.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
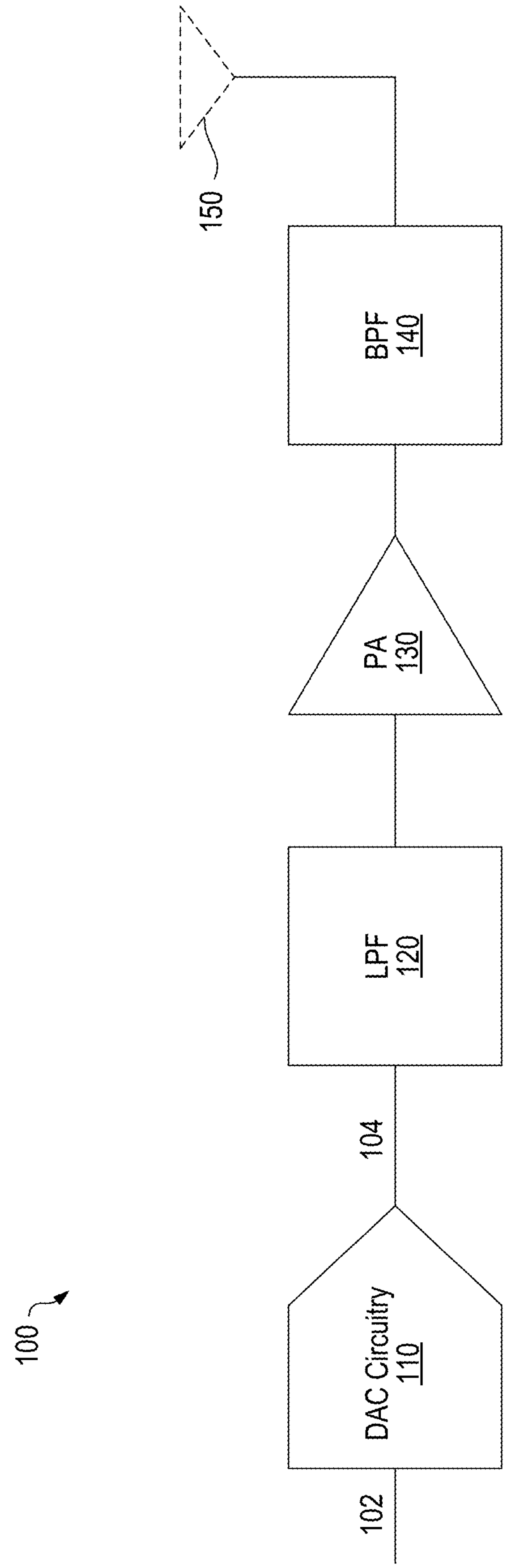
FIG. 1 illustrates a block diagram of a computing system.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

In a computer (or electronic) system, data may be converted from a digital format to an analog format for further processing. In one example, a data signal is received in a digital format and converted to an analog format, and further processed (e.g., filtered and/or other processing techniques) in an analog domain. In one example, the computer system is a communication system, audio system, or video system, among others. In a computer system, digital-to-analog converter (DAC) circuitry is used to convert a signal from a digital format (digital domain) to an analog format (digital domain).

The DAC circuitry described in the following includes one or more unit cell circuitries. A unit cell circuitry includes cascode circuitry and charge injection circuitry that injects charge onto the source node cascode circuitry based on the value of data signal. As a change in charge driven on the source node of the cascode circuitry is replenished by the drain node of the cascode circuitry, a current pulse is generated at the drain of the cascode circuitry based on the injected charge. The unit cell circuitries of a DAC circuitry are connected together at the drain nodes of the cascode circuitries. Accordingly, the current pulses are summed and a summed output current proportional to the data signals is generated. The DAC circuitry as described herein generates current pulses that have a width that is independent of the control signals (e.g., data signals) of the unit cells. Thus, the DAC circuitry is able to use current pulse widths that are below the maximum data signal frequency, and has a higher bandwidth. Further, the DAC circuitry has described herein provides a less complex implementation of an interleaved DAC that is able to generate output signals at frequencies beyond the clock signal frequency. Further, the DAC circuitry described herein mitigates noise generated during the conversion process and/or has a lower power consumption as compared to other DAC circuitry implementations.

FIG. 1 illustrates a computer system 100, according to one or more examples. In one example, FIG. 1 illustrates at least a portion of signal (or data) processing circuitry of the computer system 100. The computer system 100 may be a communication system, audio processing system, or a video processing system, among others. In an example where the computer system 100 is a communication system, FIG. 1 illustrates at least a portion of transmitter circuitry of the communication system.

The computer system 100 includes DAC circuitry 110, filter circuitry 120, power amplifier circuitry 130, and filter circuitry 140. In one example, the computer system 100 further includes an antenna 150 that is configured to output a data signal. Further, the DAC circuitry 110 may be referred to as a radio frequency (RF) DAC. In one example, one or more of the filter circuitry 120, the power amplifier circuitry 130, and the filter circuitry 140 are at least a part of the signal processing circuitry of the computer system 100. In one example, additional, and/or alternative, signal processing circuitry may be included within the computer system 100. In an example where the computer system 100 is an audio processing system or a video processing system, one or more of the filter circuitry 120, the power amplifier circuitry 130, and the filter circuitry 140 may be replaced with audio processing circuitry or video processing circuitry. In one example, the DAC circuitry, the filter circuitry 120, the power amplifier circuitry 130, and the filter circuitry 140 are part of transceiver circuitry of the computer system 100. In one example, the data signal 102 is provided another circuitry element with the computer system 100.

The DAC circuitry 110 receives a data signal (e.g., input signal) 102 in a digital format (or domain), converts the data signal 102 from a digital format to an analog format, generating the signal 104. The data signal 102 is received from a circuit element of the computer system 100 or external to the computer system 100. The signal 104 is processed by the filter circuitry 120, the power amplifier circuitry 130, and the filter circuitry 140 (and/or by other processing circuitry) in an analog domain.

In one or more examples, the filter circuitry 120 is one of a low pass filter circuitry, band pass filter circuitry, or high pass filter circuitry, among others. Further, the filter circuitry 140 is one of a low pass filter circuitry, band pass filter circuitry, or high pass filter circuitry, among others. In other examples, the computer system 100 may include additional and/or alternative processing circuitry.

Figure 2A:
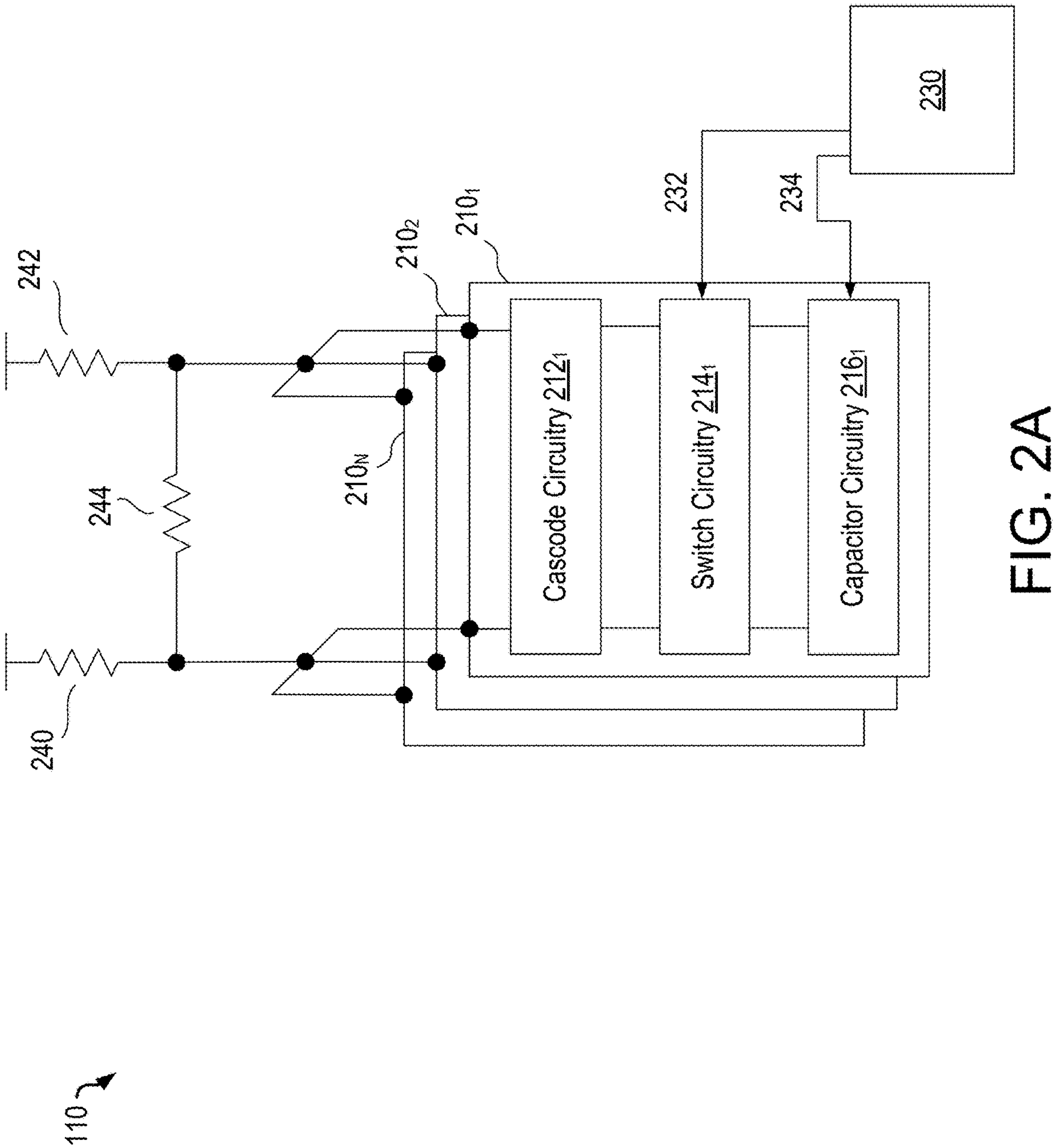
FIG. 2A illustrates a block diagram of digital-to-analog converter circuitry.

FIG. 2A illustrates a block diagram of the DAC circuitry 110. The DAC circuitry 110 includes one or more unit cell circuitries 210. The DAC circuitry 110 may include additional unit cells not illustrated in FIG. 2A. The additional unit cells may be configured similar to the unit cell circuitries 210. In one or more examples, the DAC circuitry 110 additionally includes the control circuitry 230. In other examples, the control circuitry is external to and connected to the DAC circuitry 110.

The outputs of the unit cell circuitries 210 are connected to each other. The outputs of the unit cell circuitries 210 are connected to the load (e.g., represented by a load resistor 244). In one example, the unit cell circuitries 210 are connected in parallel. In such an example, the output of the unit cells are combined (e.g., summed or combined in another way) and provided to the load. Further, the outputs of the unit cell circuitries 210 are connected to the termination resistors 240 and 242. In other examples, the DAC circuitry 110 may include additional unit cells configured similar to those of unit cell circuitries 210 and that are connected to the load.

The unit cell circuitries 210 are unary or binary unit cells. In one example, the unit cell circuitries 210 include unit cell circuitries $\mathbf{210}_1$-$\mathbf{210}_N$. N is more than one. In one example, N is more than 2. Each unit cell circuitry 210 includes a respective cascode circuitry 212, switch circuitry 214, and capacitor circuitry 216. In one example, the unit cell circuitry $\mathbf{210}_1$ includes the cascode circuitry $\mathbf{212}_1$, the switch circuitry $\mathbf{214}_1$, and the capacitor circuitry $\mathbf{216}_1$, the unit cell circuitry $\mathbf{210}_2$ includes the cascode circuitry $\mathbf{212}_2$, the switch circuitry $\mathbf{214}_2$, and the capacitor circuitry $\mathbf{216}_2$, and the unit cell circuitry $\mathbf{210}_N$ includes the cascode circuitry $\mathbf{212}_N$, the switch circuitry $\mathbf{214}_N$, and the capacitor circuitry $\mathbf{216}_N$.

The unit cell circuitries $\mathbf{210}_1$-$\mathbf{210}_N$ are connected in parallel. In one example, as the unit cell circuitries $\mathbf{210}_1$-$\mathbf{210}_N$ are connected in parallel, the outputs of the unit cell circuitries $\mathbf{210}_1$-$\mathbf{210}_N$ are combined (e.g., summed).

The cascode circuitry 212 includes one or more cascodes. A cascode includes one or more transistors. The transistors have a drain node connected to an output of the unit cell. The cascode circuitry 212 is described in greater detail in the following.

The switch circuitry 214 connects and disconnects the capacitor circuitry 216 to and from the cascode circuitry 212. Connecting the capacitor circuitry 216 with the cascode circuitry 212 via the switch circuitry 214 injects a charge onto the cascode circuitry 212. In such an example, the switch circuitry 214 and capacitor circuitry 216 functions as charge injection circuitry. In one example, the charge is injected onto the source node or nodes of transistors of the cascode circuitry 212.

The switch circuitry 214 includes one or more switches that connect and disconnect the capacitor circuitry 216 to and from the source nodes of the cascode circuitry 212. In one example, the switch circuitry 214 receives one or more control signals 232 from the control circuitry 230. The one or more control signals 232 indicate the state (open or closed) of the switches of the switch circuitry 214. In one example, the one or more control signals 232 indicate whether the switches of the switch circuitry 214 connects the capacitor circuitry 216 to the cascode circuitry 212 or that the switches of the switch circuitry 214 disconnects the capacitor circuitry 216 from the cascode circuitry 212. The switch circuitry 214 is described in greater detail in the following. In another example, capacitor circuitry 216 comprises one or more switches which pre-charges the capacitors of capacitor circuitry 216 to different charge states in one phase, and switch circuitry 214 connects said capacitors to the cascode circuitry in the other.

The capacitor circuitry 216 includes one or more capacitors. In one example, the capacitor circuitry 216 includes more than two capacitors. In one or more examples, the capacitor circuitry 216 includes a capacitor array that includes two or more capacitors that can be selectable to adjust the overall capacitance value of the capacitor circuitry 216.

In one example, the capacitor circuitry 216 includes one or more switches that are used to charge the capacitors of the capacitor circuitry 216 to one or more voltages. In one example, the capacitor circuitry 216 receives one or more control signals 234 from the control circuitry 230 that control the charging of the capacitor(s) of the capacitor circuitry 216 and/or the selection of capacitors within the capacitor circuitry 216. The capacitor circuitry 216 is described in greater detail in the following.

The control circuitry 230 generates and outputs the control signals 232 and 234. The control signals 232 and 234 are binary signals. In one example, the control signals 232 and 234 are generated based on a value of a received data signal.

In one example, the DAC circuitry 110 has 3 bit segmentation. In one or more examples, the DAC circuitry 110 includes one or more unit cells (e.g., the unit cell circuitries 210) that are unary cells. The DAC circuitry 110 may additionally, or alternatively, include one or more unit cells (e.g., the unit cell circuitries 210) that are binary cells.

Figure 2B:
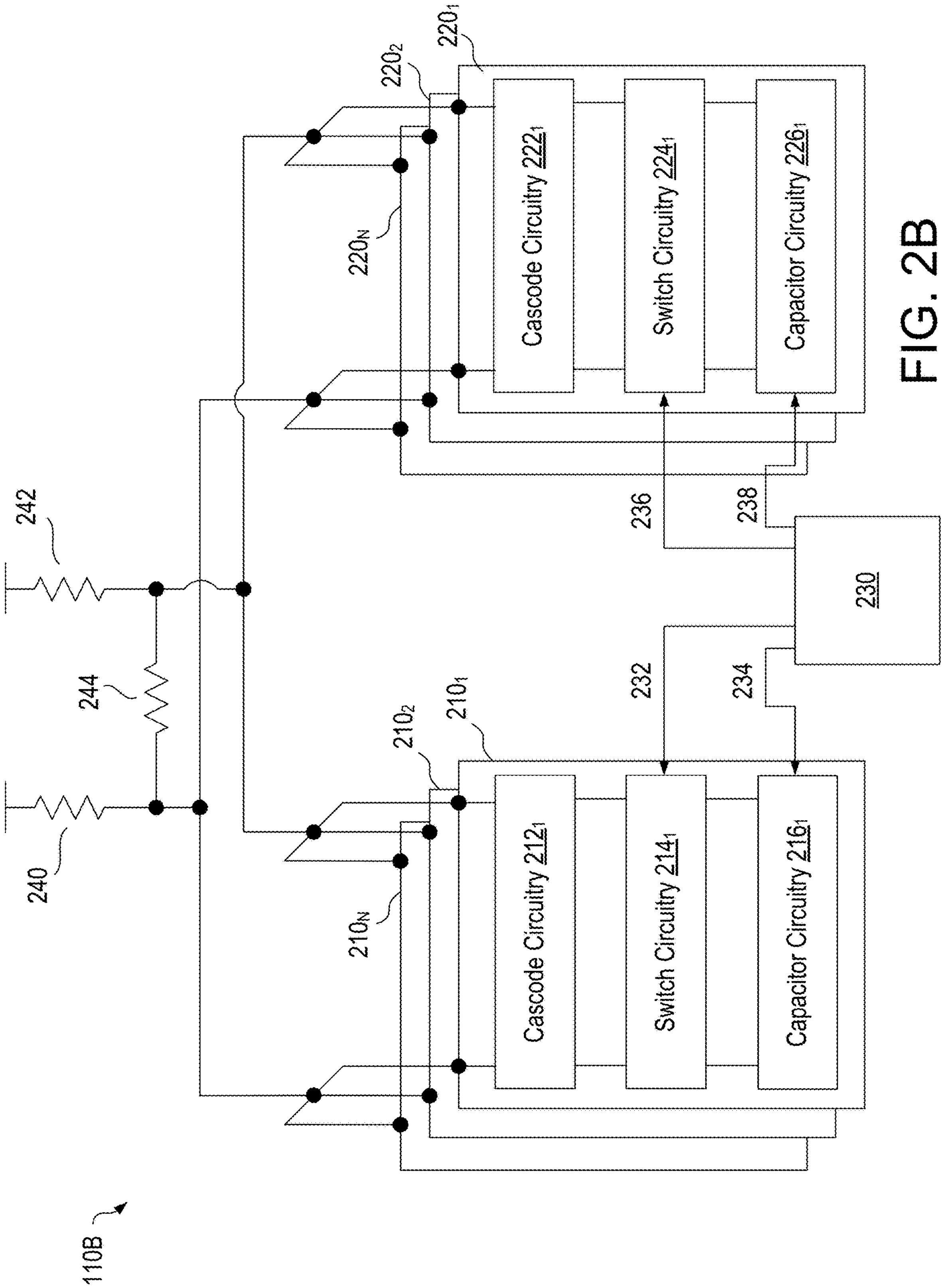
FIG. 2B illustrates a block diagram of digital-to-analog converter circuitry.

FIG. 2B illustrates a block diagram of the DAC circuitry 110B. The DAC circuitry 110 includes one or more unit cell circuitries 210 and/or one or more unit cell circuitries 220. The DAC circuitry 110 may include additional unit cells not illustrated in FIG. 2. The additional unit cells may be configured similar to the unit cell circuitries 210 and/or the unit cell circuitries 220. The unit cell circuitries 210 and the unit cell circuitries 220 may be configured as interleaved unit cell circuitries.

The outputs of the unit cell circuitries 210 are connected to the outputs of the unit cell circuitries 220. The outputs of the unit cell circuitries 210 and the outputs of the unit cell circuitries 220 are connected to the load (e.g., represented by a load resistor 244). In one example, the unit cell circuitries 210 and the unit cell circuitries 220 are connected in parallel. In such an example, the output of the unit cells are combined (e.g., summed or combined in another way) and provided to the load. Further, the outputs of the unit cell circuitries 210 and 220 are connected to the termination resistors 240 and 242.

The unit cell circuitries 220 are configured similar to the unit cell circuitries 210. In one example, the unit cell circuitries 220 include unit cell circuitries $\mathbf{220}_1$-$\mathbf{220}_N$. Each unit cell circuitry 220 includes a respective cascode circuitry 222, switch circuitry 224, and capacitor circuitry 226. The cascode circuitry 222 is configured similar to the cascode circuitry 212, the switch circuitry 224 is configured similar to the switch circuitry 214, and the capacitor circuitry 226 is configured similar to the capacitor circuitry 216.

The unit cell circuitries $\mathbf{220}_1$-$\mathbf{220}_N$ are connected in parallel. In one example, as the unit cell circuitries $\mathbf{220}_1$-$\mathbf{220}_M$ are connected in parallel, the outputs of the unit cell circuitries $\mathbf{220}_1$-$\mathbf{220}_N$ are combined (e.g., summed).

In the DAC circuitry 110B, the control circuitry 230 generates and outputs the control signals 232-238. The control signals 232-238 are binary signals. In one example, the control signals 232-238 are generated based on a value of a received data signal.

Figure 3:
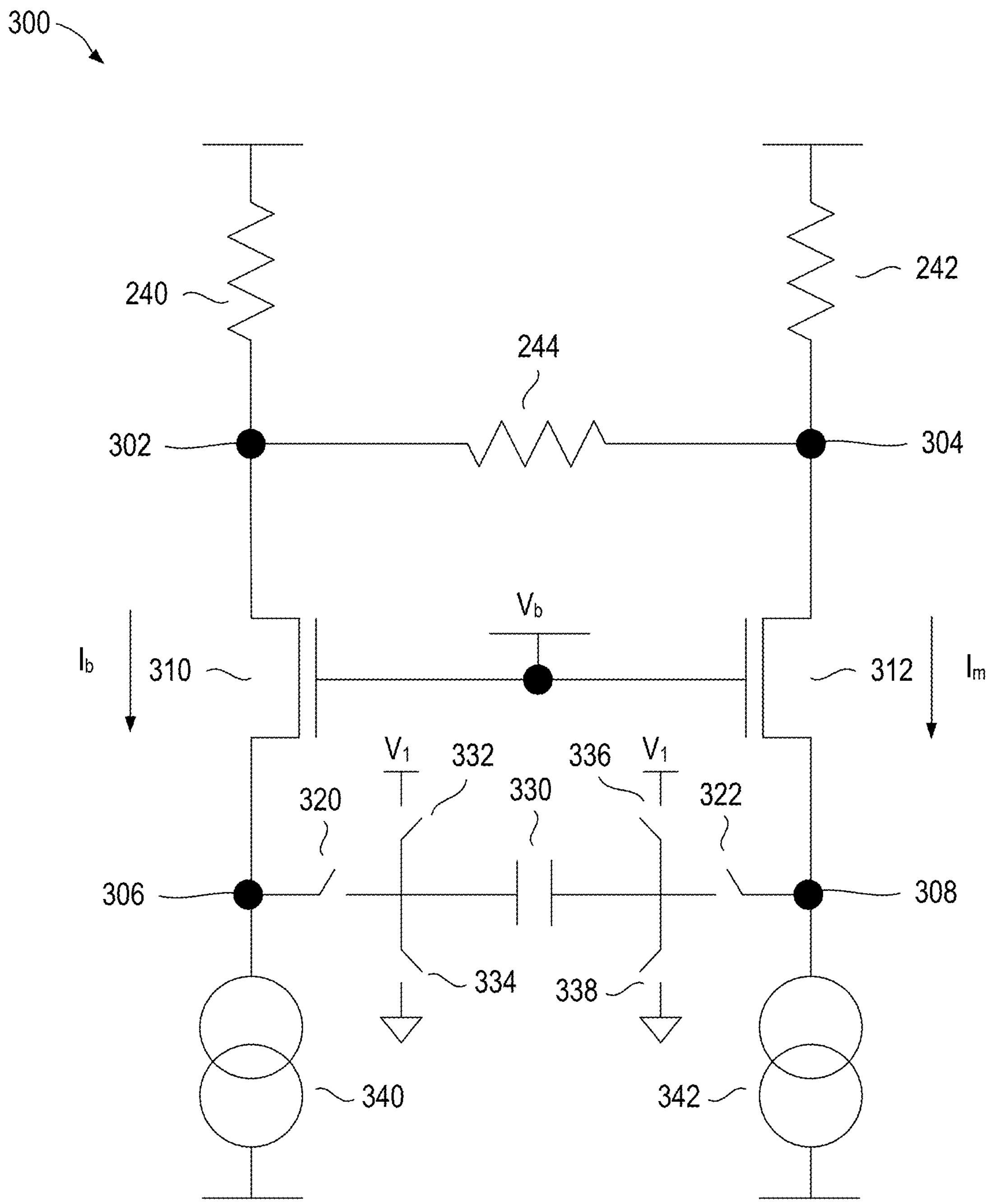
FIG. 3 illustrates a circuit diagram of unit cell circuitry.

FIG. 3 illustrates an example circuit diagram of a unit cell circuitry 300, according to one or more examples. The unit cell circuitry 300 may be an example of the unit cell circuitry 210 of FIG. 2A. The unit cell circuitry 300 has outputs (e.g., outputs (nodes) 302 and 304) that are connected to the load (e.g., the load resistor 244) and the termination resistors 240 and 242. The unit cell circuitry 300 includes transistors 310 and 312, switches 320, 322, 332, 334, 336, and 338, capacitor 330, and current sources 340 and 342. The transistors 310 and 312 are cascode transistors (e.g., part of the cascode circuitry 212 of FIG. 2A). The switches 320, and 322 are part of switching circuitry (e.g., part of the switch circuitry 214 of FIG. 2A). The capacitor 330 and switches 332-338 are part of capacitor circuitry (e.g., the capacitor circuitry 216 of FIG. 2A).

The transistors 310 and 312 are n-channel metal-oxide-semiconductor (NMOS) transistors. The gate nodes of the transistors 310 and 312 receive the bias voltage signal $V_b$. A drain of the transistor 310 is connected to the output node 302. A source of the transistor 310 is connected to the node 306. A drain of the transistor 312 is connected to the output node 304. A source of the transistor 312 is connected to the node 308.

The switch 320 connects and disconnects the capacitor 330 to and from the node 306. The switch 322 connects and disconnects the capacitor 330 to and from the node 308. Accordingly, the switch 320 selectively connects the capacitor 330 with the source of the transistor 310, and the switch 322 selectively connects the capacitor 330 with the source of the transistor 312. The switches 320 and 322 are controlled via control signals (e.g., the control signal 232 of FIG. 2A).

In one example, the capacitor 330 is a single capacitor. In other examples, the capacitor 330 represents one or more capacitors, or a selectable capacitor array. In one example, the capacitor 330 has a capacitance of one or more femtofarads.

The current source 340 is connected to the node 306. Accordingly, the current source 340 is connected to the source of the transistor 310. The current source 342 is connected to the node 308. Accordingly, the current source 342 is connected to the source of the switches 322. The current source 340 provides a bleed current to the transistor 310. The current source 342 provides a bleed current to the transistor 312. The bleed currents return the transistors 310 and 312 to a steady state.

The switches 332-338 control the charging and/or discharging the capacitor 330. For example, the switches 332-338 control charging the capacitor 330 to a first voltage (e.g., V1) and/or to a reference voltage (e.g., a ground voltage). The switches 332-338 are controlled via control signals (e.g., the control signal 234 of FIG. 2A). In one example, the switches 332 and 338 are driven by a first control signal and the switches 334 and 336 are driven by a second control signal. The control signals may be provided by control circuitry (e.g., the control circuitry 230 of FIG. 2A). In one example, the polarity of the first control signal is opposite the polarity of the second control signal. Accordingly, when the switches 332 and 338 are open, the switches 334 and 336 are closed. Further, when the switches 334 and 336 are open, the switches 332 and 338 are closed.

In one example, closing the switches 320 and 322 connects the capacitor 330 to the nodes 306 and 308. Connecting the capacitor 330 with the nodes 306 and 308 injects charge into the source of the transistor 310 and the transistor 312 based on the received data signal. The charge disturbance at the sources of the transistors 310 and 312 is replenished from the drains of the transistors 310 and 312. Accordingly, a current pulse is generated by the drain of the transistors 310 and 312 and is output via the output nodes 302 and 304. Stated another way, closing the switches 320 and 322 creates an imbalance within the unit cell circuitry 300 (e.g., within the transistors 310 and 312).

In one example, before the switches 320 and 322 are closed, the voltage at the source of the transistor 310 or the transistor 312 corresponds to the difference between voltage $V_b$, the transistor threshold ($V_t$) of the transistor 310 or 312, and an overdrive voltage of the transistors 310 or 312 ($V_{over}$) (e.g., $V_b$-$V_t$-$V_{over}$).

When the switches 320 and 322 are closed, the charge on the capacitor 330 generates a current difference at the nodes 306 and 308 (e.g., between the corresponding cascode circuitries including the transistors 310 and 312). The current difference results from the charge on the capacitor 330. In one example, the capacitor 330 is pre-charged to a differential voltage. When the switches 320 and 322 are closed, and the capacitor 330 is connected to the nodes 306 and 308, the unit cell circuitry 300 attempts to return to steady state of $V_b$-$V_t$-$V_{over}$. However, as the current sources 340 and 342 provides a constant current, the charge injected by the capacitor 330 is discharged through the transistors 310 and 312 (e.g., the corresponding cascode circuitries). In one example, to compensate an increased in charge at the node 306 by connecting the capacitor 330 to the node 306, current flowing through the transistor 310 from the drain of the transistor 310 to the source of the transistor 310 is decreased.

In one example, the current source 340 provides (e.g., sinks) the current $I_b$. Connecting the capacitor 330 to the node 306, decreases the voltage at the node 306. As the capacitor 330 discharges, the voltage at the node 306 increases until a steady state is reached. The current source 342 provides (e.g., sinks) the current $I_m$. Connecting the capacitor 330 to the node 308, increases the voltage at the node 308 (e.g., there is excess charge at node 308). As the capacitor 330 discharges, the voltage at the node 308 decreases until a steady state is reached. Due to the inclusion of the capacitor 330 and the switches 320 and 322, the current pulse width of the current signals $I_b$ and/or $I_m$ are not limited by the rise and/or fall time of a corresponding control signal. In one example, injecting charge via the capacitor 330 and the switches 320 and 322, increases the bandwidth of the unit cell circuitry 300, and mitigates noise of the unit cell circuitry 300, improving the efficiency of the corresponding DAC circuitry.

Figure 4:
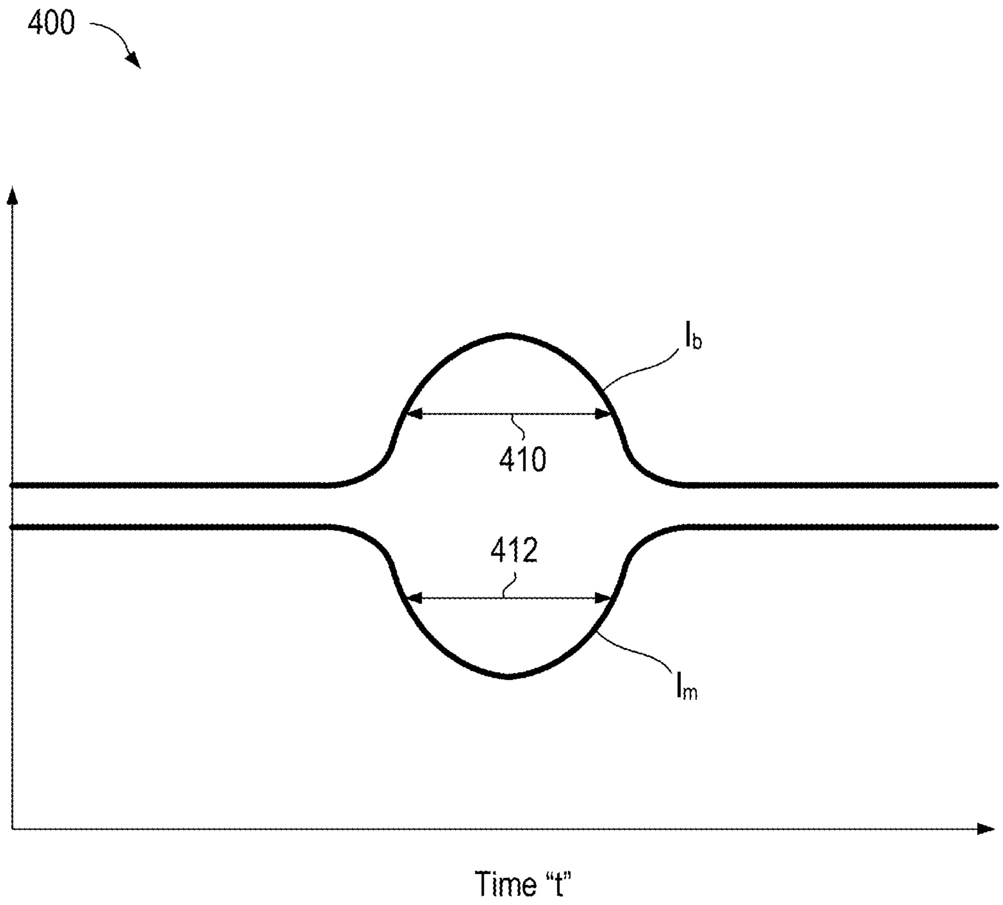
FIG. 4 illustrates a waveform diagram of the currents within unit cell circuitry.

FIG. 4 illustrates graph 400 of waveforms for the current signal $I_b$ and the current signal $I_m$. The current signal $I_b$ has a pulse width of 410, and the current signal $I_m$ has a pulse width of 412. The pulse widths 410 and 412 vary based on the capacitance of the capacitor 330 of FIG. 3, and the transconductance of the transistors 310 and 312, respectively. In one example, the pulse width 410 is proportional to the ratio of the transconductance of the transistor 310 relative to the capacitance of the capacitor 330. The pulse width 412 is proportional to the ratio of the gain of the transistor 312 relative to the capacitance of the capacitor 330.

Figure 5:
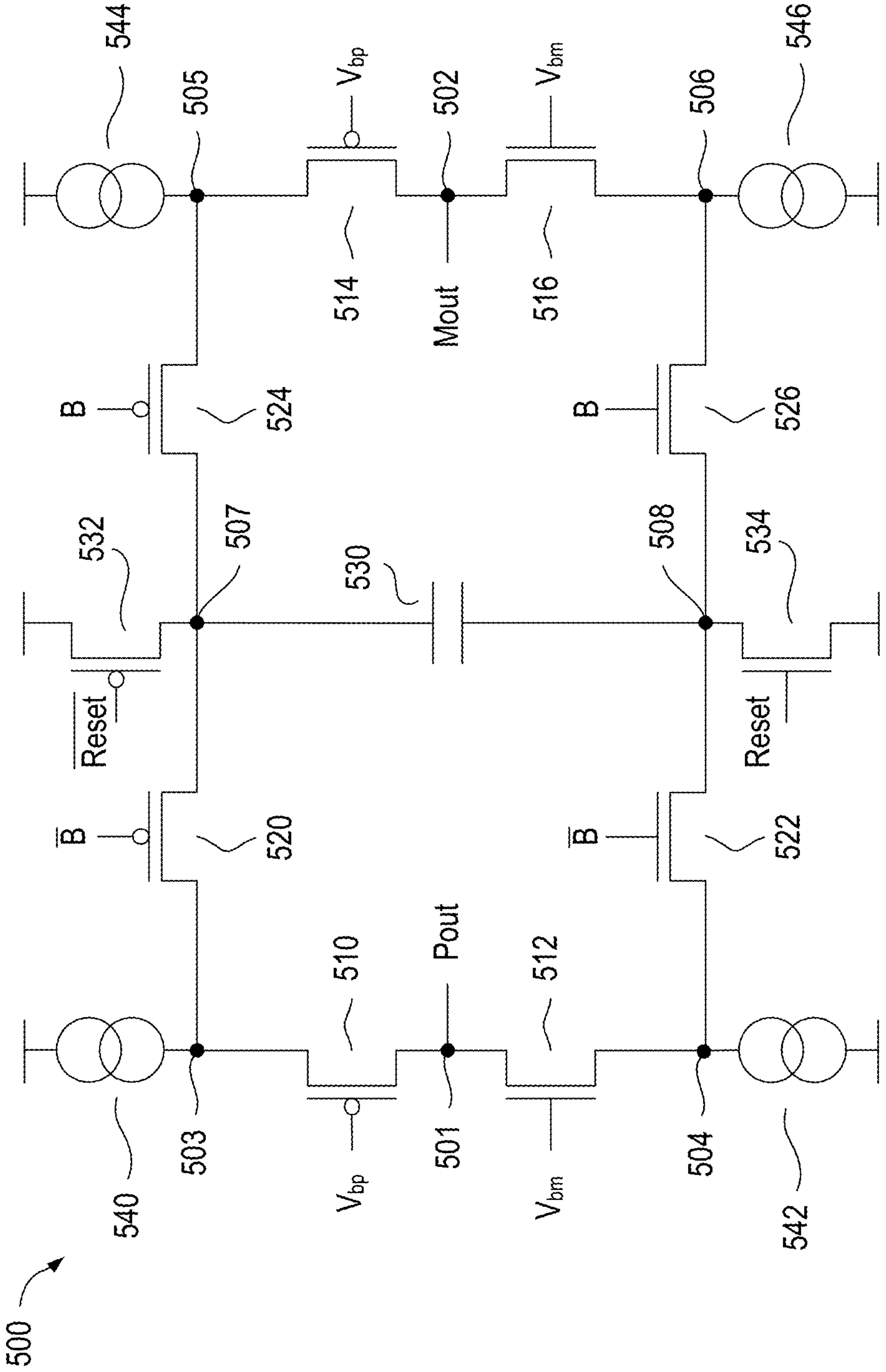
FIG. 5 illustrates a circuit diagram of unit cell circuitry.

FIG. 5 illustrates an example circuit diagram of a unit cell circuitry 500, according to one or more examples. The unit cell circuitry 500 may be an example of the unit cell circuitry 210 of FIG. 2A. The unit cell circuitry 500 has outputs Pout and Mout (e.g., output nodes 501 and 502) that are connected to a load and termination resistors (not shown). The unit cell circuitry 500 includes transistors 510, 512, 514, 516, 520, 522, 524, 526, 532, and 534, capacitor 330, and current sources 540, 542, 544, and 546. The transistors 510-516 are cascode transistors (e.g., part of the cascode circuitry 212 of FIG. 2A). The transistors 520-526 are part of switching circuitry (e.g., part of the switch circuitry 214 of FIG. 2A). The capacitor 530 and transistors 532 and 534 are part of capacitor circuitry (e.g., the capacitor circuitry 216 of FIG. 2A).

The transistors 510 and 514 are p-channel metal-oxide-semiconductor (PMOS) transistors. The transistors 512 and 516 are NMOS transistors. The gate nodes of the transistors 510 and 514 are connected to a node that receives the bias signal $V_{bp}$. The gate nodes of the transistors 512 and 516 are connected to a node that receives the bias signal $V_{bm}$. A drain node of the transistor 510 and a drain of the transistor 512 are connected to the output node 501. A source node of the transistor 510 is connected to the node 503. A source node of the transistor 512 is connected to the node 504. A drain node of the transistor 514 and a drain node of the transistor 516 are connected to the output node 502. A source node of the transistor 514 is connected to the node 505. A source node of the transistor 516 is connected to the node 506.

The transistors 520 and 524 are PMOS transistors. The transistors 522 and 526 are NMOS transistors. In other examples, the transistors 520 and 524 are NMOS transistors, and/or the transistors 522 and 526 are PMOS transistors. The transistor 520 operates as a switch to selectively connect and disconnect the capacitor 530 to and from the node 503. The transistor 522 operates as a switch to selectively connect and disconnect the capacitor 530 to and from the node 504. The transistor 524 operates as a switch to selectively connect and disconnect the capacitor 530 to and from the node 505. The transistor 526 operates as a switch to selectively connect and disconnect the capacitor 530 to and from the node 506. Accordingly, the transistor 520 selectively connects the capacitor 530 with the source of the transistor 510, the transistor 522 selectively connects the capacitor 530 with the source of the transistor 512, the transistor 524 selectively connects the capacitor 530 with the source of the transistor 514, and the transistor 526 selectively connects the capacitor 530 with the source of the transistor 516. The transistors 520-526 are controlled via control signals indicated by B and B bar (e.g., inverse B). With reference to FIG. 2A, the control signals may be the control signal 232.

In one example, the source nodes of the transistors 520 and 524 are connected to the node 507, the drain node of the transistor 520 is connected to the node 503 and the drain node of the transistor 524 is connected to the node 505. Further, the source nodes of the transistors 522 and 526 are connected to the node 508, the drain node of the transistor 522 is connected to the node 504 and the drain node of the transistor 526 is connected to the node 506.

In one example, the capacitor 530 is a single capacitor. In other examples, the capacitor 530 represents one or more capacitors, or a selectable capacitor array. The capacitor (or capacitors or selectable capacitor array) is connected between nodes 507 and 508. In one example, the capacitor 530 has a capacitance of one or more femtofarads. While FIG. 5 illustrates a particular combination of a capacitor and transistors 520-526, 532, and 534, in other examples, the unit cell circuitry 500 my include multiple capacitors, multiple sets of transistors 532 and 534, and/or multiple sets of transistors 520-526. In an example where there are multiple capacitors, each capacitor may be connected to a set of transistors configured similar to that of the transistors 532-534 and/or are connected to a set of transistors configured similar to that of the transistors 520-526.

The current source 540 is connected to the node 503. Accordingly, the current source 540 is connected to the source node of the transistor 510. The current source 542 is connected to the node 504. Accordingly, the current source 542 is connected to the source node of the transistor 512. The current source 544 is connected to the node 505. Accordingly, the current source 544 is connected to the source node of the transistor 514. The current source 546 is connected to the node 506. Accordingly, the current source 546 is connected to the source node of the transistor 516. The current sources 540 and 542 provide bleed currents to the transistors 510 and 512. The current sources 544 and 546 provide bleed currents to the transistors 514 and 516.

The transistors 532-534 control the charging and/or discharging of the capacitor 530. For example, the transistors 532 control charging the capacitor 530 to a first voltage and/or to a reference voltage. The transistor 532 is a PMOS transistor. In another example, the transistor 532 is a NMOS transistor. A gate node of the transistor 532 is connected to a node that receives the reset signal (reset). The source node of the transistor 532 is connected to a node that receives a reference voltage. A drain of the transistor 532 is connected to the node 507.

The transistor 534 is a NMOS transistor. In another example, the transistor 534 is a PMOS transistor. A gate node of the transistor 534 is connected to a node that receives the inverse reset signal (reset bar). The source node of the transistor 534 is connected to a node that receives a reference voltage. A drain node of the transistor 534 is connected to the node 508. The reset signal and inverse reset signal are control signals (e.g., the control signal 234 of FIG. 2A). The transistor 532 and 534 operate to reset the charge on the capacitor 530 (e.g., pre-charge the capacitor 530). In one or more examples, the reset signal and inverse reset signal pre-charge the capacitor 530 to a predetermined, or known, voltage value. After the capacitor 530 is pre-charged, the capacitor 530 is connected to the nodes 503 and 506 or 504 and 505 based on the control signal B and inverse control signal B.

In one example, the transistors 520, 522, 524, and 526 connect the capacitor 530 to the nodes 503 and 504 or 505 and 506. Connecting the capacitor 530 with the nodes 503 and 504 or 505 and 506 injects charge into the source nodes of the transistors 510 and 516 or the source nodes of the transistors 514 and 512. The charge disturbance at the sources of the transistors 510 and 512 or 514 and 516 is replenished from the drains of the transistors 510, 512, 514, and 516, respectively. Accordingly, a current pulse is generated by the drain of the transistors 510 and 512 or 514 and 516, and is output via the output nodes 501 and 502.

In one example, when the transistors 520 and 526 connect the capacitor 530 with the nodes 503 and 506, the transistors 522 and 524 disconnect the capacitor from the nodes 504 and 505. When the transistors 520 and 526 disconnect the capacitor 530 with the nodes 503 and 506, the transistors 522 and 524 connect the capacitor 530 with the nodes 504 and 505. The transistors 520 and 522 connect the capacitor 530 with the nodes 503 and 504 and the transistors 524 and 526 connect the capacitor with the nodes 505 and 506 based on a sign of the corresponding data signal. For example, charge is injected into the source nodes of the transistors 510, 512, 514, and 516 based on the value of the control signal B (e.g., a digital control bit). In one example, when the transistors 520 and 526 connect the capacitor 530 with the nodes 503 and 506 and the transistors 522 and 524 disconnect the capacitor from the nodes 504 and 505, current is pulled from Mout (e.g., node 502) via the output node 502, and the transistors 516, 526, 520, and 510, and output via the output node 501. In one example, when the value of the control signal B is 1, charge is injected into the source of the transistor 510 as the transistors 520 and 526 couple the capacitor 530 with the nodes 503 and 506. Current is caused to be sourced from the Pout (the output node 501) and an equal amount of current to be sunk at Mout (the output node 502). Accordingly, a positive differential current is generated across the output nodes 501 and 502). When the transistors 522 and 524 connect the capacitor 530 with the nodes 504 and 505 and the transistors 520 and 526 disconnect the capacitor from the nodes 503 and 506, current is pulled from Pout via the node 504, and the transistors 512, 522, 524, and 514, and output via the output node 502.

In one example, when the value of the control signal B is 0, charge is injected into the source of the transistor 514 as the transistors 522 and 524 couple the capacitor 530 with the nodes 504 and 505. Current is caused to be sourced from the Mout (the output node 502) and an equal amount of current to be sunk at Pout (the output node 501). Accordingly, a negative differential current is generated across the output nodes 501 and 502.

In one or more example, as the unit cell circuitry 500 includes complementary pairs of cascode transistors (e.g., the transistors 510 and 514 and the transistors 512 and 516), the unit cell circuitry 500 allows for a differential output current that exceeds the bias current of the unit cell circuitry 500. Accordingly, the efficiency of the unit cell circuitry 500 and the corresponding DAC circuitry is increased. Further, as the bias current is a primary source of noise within the corresponding DAC circuitry, a DAC circuitry including the unit cell circuitry 500 has lower amounts of noise (e.g., lower common mode noise) as compared to a DAC circuitry that does not include the unit cell circuitry 500.

Figure 6:
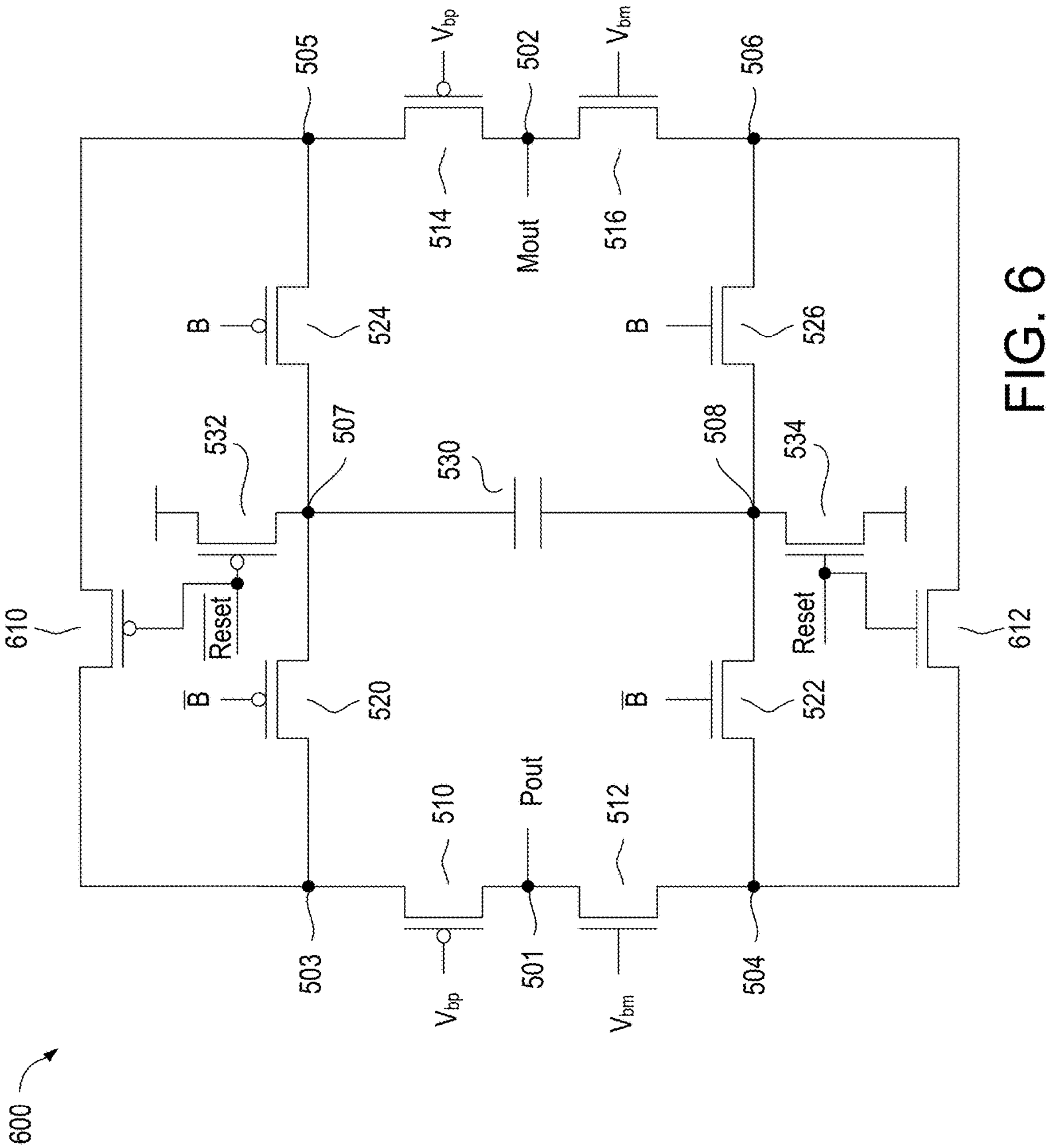
FIG. 6 illustrates a circuit diagram of unit cell circuitry.

FIG. 6 illustrates an example circuit diagram of a unit cell circuitry 600, according to one or more examples. The unit cell circuitry 600 may be an example of the unit cell circuitry 210 of FIG. 2A. The unit cell circuitry 600 is configured similar to the unit cell circuitry 500 of FIG. 5. For example, the unit cell circuitry 600 includes transistors 510, 512, 514, 516, 520, 522, 524, 526, 532, and 534, and capacitor 330, which are described in greater detail with regard to FIG. 5 above. However, instead of the current sources 540, 542, 544, and 546, which are included in the unit cell circuitry 500, the unit cell circuitry 600 includes transistors 610 and 612 that are connected between the nodes 503 and 505 and 504 and 506, respectively. In a DAC circuitry, current is switched from one output node (e.g., the output node 501) to another output node (e.g., the output node 502) depending on the value of the corresponding digital data bit (e.g., the digital control signal B). A bleed current provided by a current source (e.g., the current sources 540, 542, 544, and 546 of FIG. 5) mitigates the incomplete settling of the source nodes of the transistors 510, 512, 514, and 516 that may occur when the current is switching. The inclusion of current sources increases the power consumption and noise of the unit cell and corresponding DAC circuitry. Accordingly, as the unit cell circuitry 600 omits current sources, the power consumption and noise of the unit cell circuitry 600 and corresponding DAC circuitry is less than that of unit cells and corresponding DAC circuitries that include current sources.

As compared to the unit cell circuitry 500 of FIG. 5, the unit cell circuitry 600 of FIG. 6, includes differential reset phase as the sources of the cascode circuitry (e.g., the transistors 510, 512, 514, and 516). For example, the unit cell circuitry 600 includes transistors 610 and 612 that function with the transistors 532 and 534, respectively, to operate as a differential reset phase.

The transistor 610 is a PMOS transistor. The transistor 612 is an NMOS transistor. In other examples, the transistor 610 is a NMOS transistor and the transistor 612 is a PMOS transistor.

As is illustrated in FIG. 6, the gate node of the transistor 610 is connected to a gate node of the transistor 532. The gate nodes of the transistor 610 and the transistor 532 are connected to a node that provides an inverted reset signal (reset bar signal), and receive the inverted reset signal via the node. A source node of the transistor 610 is connected to the node 503. Accordingly, the source node of the transistor 610 is connected to the source node of the transistor 510. A drain node of the transistor 610 is connected to the node 505. Accordingly, the drain node of the transistor 610 is connected to the source node of the transistor 514.

The gate node of the transistor 612 is connected to a gate node of the transistor 534. The gate nodes of the transistor 612 and the transistor 534 are connected to a node that provides a reset signal, and receive the inverted reset signal via the node. A source node of the transistor 612 is connected to the node 506. Accordingly, the source node of the transistor 612 is connected to the source node of the transistor 516. A drain node of the transistor 612 is connected to the node 504. Accordingly, the drain node of the transistor 612 is connected to the source node of the transistor 512.

In one example during a reset phase, the rest signal has a value of 1, and the inverted reset signal has a value of 0. In the reset phase, the transistor 610 connects (e.g., shorts) the transistors 510 and 514 together and the transistor 612 connects the transistors 512 and 516 together. Stated another way, the transistors 610 and 612 connect the differential cascode circuitries together during the reset phase, providing a code independent initial state for the unit cell at the start of each conversion cycle.

Figure 7:
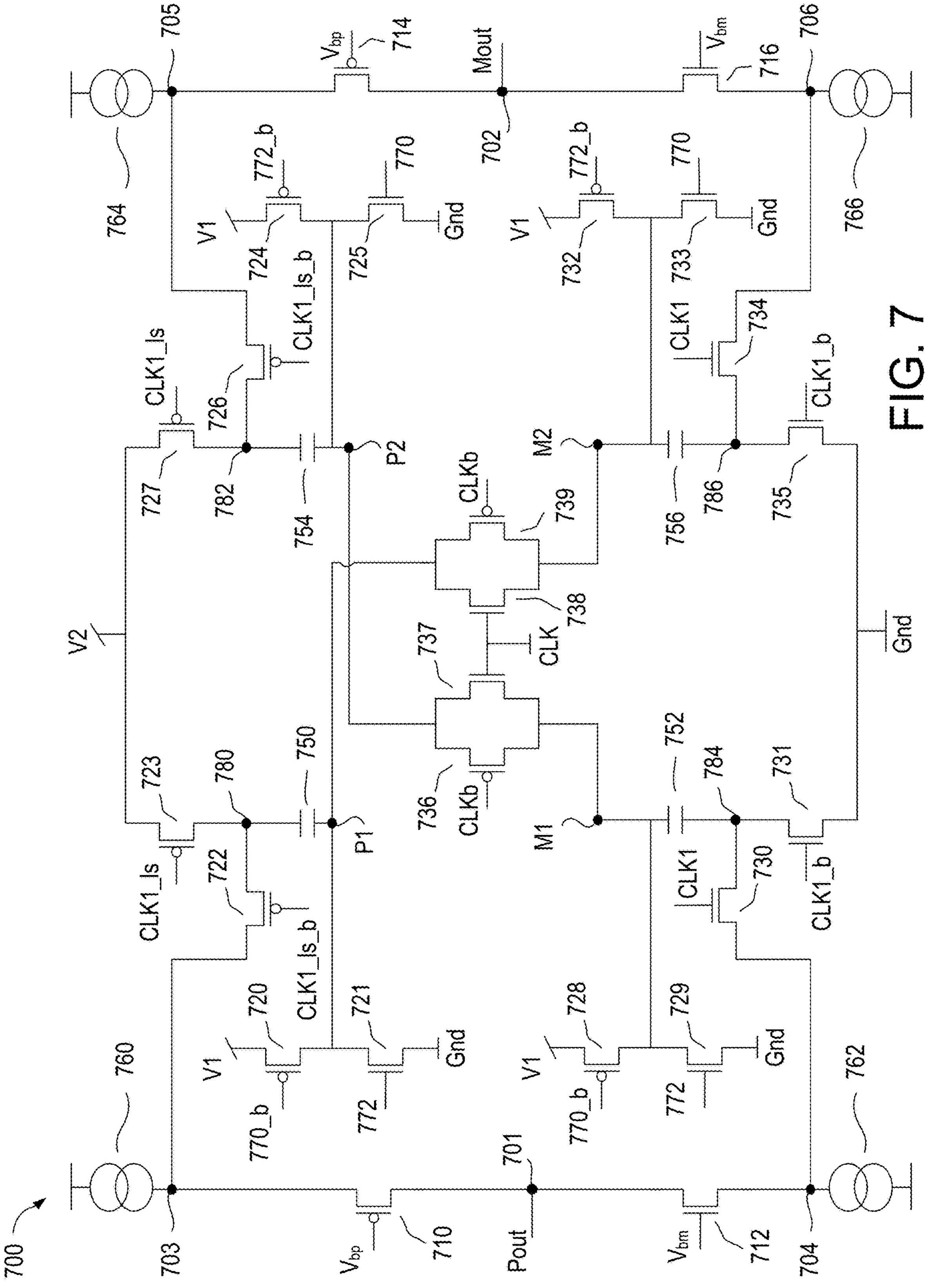
FIG. 7 illustrates a circuit diagram of unit cell circuitry.

FIG. 7 illustrates an example circuit diagram of a unit cell circuitry 700, according to one or more examples. The unit cell circuitry 700 may be an example of the unit cell circuitry 210 of FIG. 2A. The unit cell circuitry 700 has outputs Pout and Mout (e.g., output nodes 701 and 702) that are connected to a load and termination resistors (not shown). The unit cell circuitry 700 includes transistors 710, 712, 714, 716, 720-739, capacitors 750, 752, 754, and 756, and current sources 760, 762, 764, and 766. The transistors 710-716 are cascode transistors (e.g., part of the cascode circuitry 212 of FIG. 2A). The transistors 722, 726, 730, 734, and 736-739 are part of switching circuitry (e.g., part of the switch circuitry of FIG. 2A). The capacitors 750-756 and the transistors 720, 721, 723-725, 727-729, 731-733, and 735 are part of capacitor circuitry (e.g., the capacitor circuitry 216 of FIG. 2A).

The transistors 710 and 714 are PMOS transistors. The transistors 712 and 716 are NMOS transistors. The gate nodes of the transistors 710 and 714 are connected to a node that receives the bias signal $V_{bp}$. The gate nodes of the transistors 712 and 716 are connected to a node that receives the bias signal $V_{bm}$. A drain node of the transistor 710 and a drain of the transistor 712 are connected to the output node 701. A source node of the transistor 710 is connected to the node 703. A source node of the transistor 712 is connected to the node 704. A drain node of the transistor 714 and a drain node of the transistor 716 are connected to the output node 702. A source node of the transistor 714 is connected to the node 705. A source node of the transistor 716 is connected to the node 706.

The transistors 722, 726, 736 and 739 are PMOS transistors. The transistors 730, 734, 737, and 739 are NMOS transistors. In other examples, the transistors 722, 726, 736 and 739 are NMOS transistors, and/or the transistors 730, 734, 737, and 739 are PMOS transistors. The transistors 726, 730, 736, and 737 operate to selectively connect and disconnect the capacitors 752 and 754 to and from each other, and to and from the nodes 704 and 705. The transistors 722, 734, 738, and 739 operate to selectively connect and disconnect the capacitors 750 and 756 to and from each other, and to and from the nodes 703 and 706.

The transistors 722 and 726 are controlled via a level shifted inverted clock signal CLK1*_ls_b*. The transistors are controlled by the clock signals CLK1. The level shifted inverted clock signal CLK1*_ls_b* is generated from the clock signal CLK1. The CLK1 is level shifted as the voltage signal V2 may be a level shifted version the voltage signal V1. The transistors 736 and 739 are controlled by the inverted clock signal CLKb. The transistors 737 and 738 are controlled by the clock signal CLK. The inverted clock signal CLKb is an inverted version of the clock signal CLK.

In one example, the capacitors 750-756 are single capacitors. In other examples, one or more of the capacitors 750-756 represents one or more capacitors, or a selectable capacitor array.

The voltage value of the capacitors 750-756 is set during a pre-charge state. In one example, the pre-charge state occurs when the clock signal CLK has a value of zero.

The transistors 720, 721 and 723 control (e.g., reset) the voltage across (e.g., the charge on) the capacitor 750. In one example, the gate node of the transistor 720 is driven by the control signal 770*_b* and the gate node of the transistor 721 is driven by the control signal 772. The gate node of the transistor 723 is driven by the clock signal CLK1*_ls*. The clock signal CLK1*_ls* is a level shifted version of the clock signal CLK1. The control signal 770*_b* is an inverted version of the control signal 770. In one example, the control signal 770 is generated based on the data signal. For example, the control signal 770 is generated based on an inverted version of the data signal combined with the clock signal CLK. The control signal 770 has a value of zero, except for when there is a zero in the data signal and the clock signal CLK has a value of 0. The control signal 772 is generated based on the data signal. For example, the control signal 772 is generated based on the data signal combined with the clock signal CLK. The control signal 772 has a value of one only when the data signal is 1 and the clock signal CLK has a value of 0.

In one example, for a data signal having a value of 1, the control signal 772 turns on the transistor 721, the low value of level shifted clock signal CLK1_*ls* turns on the transistor 723, and a first voltage value is set on the capacitor 750 with reference to voltage V2 (via the node 780) and ground signal GND. For a data signal having a value of 0, the low value of control signal 770_*b* turns on the transistor 720, and the low value of level shifted clock signal CLK1_*ls* turns on the transistor 723, a second voltage is set on the capacitor 750 with reference to the voltage signal V2 and the voltage signal V1. The second voltage value is less than the first voltage value. In one example, the first voltage value is 1 V and the second voltage value is 0 V. In other examples, other voltage values may be used.

The transistors 724, 725 and 727 control the voltage across (e.g., the charge on) the capacitor 754. For a data signal having a value of 1, the node P2 is driven with the V1 voltage (via the transistor 724 and the inverted control signal 772) and the node 782 is driven with the voltage signal V2 (via the transistor 727 and level shifted clock signal CLK1_*ls*). Accordingly, no voltage difference is present between nodes 782 and P2, if V1 and V2 are equal. For a data signal having a value of 0, the node P2 is driven with the voltage ground signal Gnd (via the transistor 725 and the control signal 770) and the node 782 is driven with the voltage signal V2 (via the transistor 727 and the level shifted clock signal CLK1_*ls*). Accordingly, capacitor 754 is charged based on the voltage V2.

The transistors 728, 729 and 731 control the voltage across (e.g., the charge on) the capacitor 752. For a data signal having a value of 1, the node M1 is driven with the voltage ground Gnd (via the transistor 729 and the control signal 772) and the node 784 is driven with the voltage ground Gnd (via the transistor 731 and the inverted clock signal CLK1_*b*). Accordingly, a voltage difference is not present between nodes 784 and M1, and the capacitor 752 is not charged. For a data signal having a value of 0, the node M1 is driven with the voltage signal V1 (via the transistor 728 and the inverted control signal 770_*b*) and the node 784 is driven with the voltage ground Gnd (via the transistor 731 and the inverted clock signal CLK1_*b*). Accordingly, a voltage difference is present between nodes M1 and 784, and the capacitor 752 is charged based on the voltage difference V1.

The transistors 732, 733 and 735 control the voltage across (e.g., the charge on) the capacitor 756. For a data signal having a value of 1, the node M2 is driven with the voltage signal V1 (via the transistor 732 and the inverted control signal 772_*b*) and the node 786 is driven with the ground signal (via the transistor 735 and the inverted clock signal CLK1_*b*). Accordingly, a voltage difference is present between nodes M2 and 786, and the capacitor 756 is charged. For a data signal having a value of 0, the node M2 is driven with the voltage ground Gnd (via the transistor 733 and the control signal 770) and the node 786 is driven with the ground signal (via the transistor 735 and the inverted clock signal CLK1_*b*). Accordingly, no voltage difference is present between nodes M2 and 786, and the capacitor 756 is not charged.

During a charge transfer phase, the nodes P1 and M2 and M1 and P2 are pulled (e.g., connected or shorted) together. Initially, the voltage value at node P1 is equal to the voltage value at node M1, and the voltage value at node M2 is equal to the voltage value at node P2. When the data signal has a value of 1, the initial voltage value of P1 is Gnd and M2 is V1. Accordingly, current flows from M2 to P1, turning on transistors (cascodes) 710 and 716 and creating a current flow from output node 702, along the path from transistor 716, through capacitors 756 and 750, to transistor 710 and out of output node 701. The initial voltage value of the node P2 is V1 and M1 is Gnd. The voltage value at the node P2 is greater than that of the node M1. Accordingly, a current flows from P2 to M1, turning off transistors 712 and 714.

When the data signal has a value of 0, the initial voltage values of M1 is V1 and P2 is Gnd. Accordingly, current flows from node M1 to P2, turning on transistors (cascodes) 714 and 712 and creating a current flow from output node 701, along the path from transistor 712, through capacitors 752 and 754, to transistor 714 and out of output node 702. The voltage values of the node M2 is Gnd and P1 is V1. The voltage value at the node P1 is greater than that of the node M2. Accordingly, a current flows from P1 to M2, turning off transistors 710 and 716.

In one example, a pre-charge phase precedes a charge transfer phase. Accordingly, before a charge transfer phase is performed, a pre-charge phase is performed.

In the example, of FIG. 7, level shifted clock signals CLK1_*ls* and CLK1_*ls*_*b* are used to drive the transistors 722, 723, 726, and 727. The transistors 722, 723, 726, and 727 are PMOS transistors. The transistors 723 and 727 are controlled by the level shifted clock signal CLK1_*ls* to be closed during the pre-charge phase. Accordingly, the corresponding data signals are not level shifted, simplifying the design and reducing the complexity of the corresponding computer system. Further, due to the use of the pre-charge phase, any mismatch of the control signals between the cells of the corresponding computer system does not negatively affect the overall performance. Further, as the capacitors are set to a known state during pre-charge, memory effects of the cell are mitigated, and linearity is improved.

The DAC circuitry described in the above has an increased bandwidth and a decreased noise levels as compared to other DAC circuitries. For example, the DAC circuitry described in the above includes one or more unit cell circuitries that include cascode circuitry and charge injection circuitry that injects charge onto the source node cascode circuitry based on the value of an input data signal. As a change in charge driven on the source node of the cascode circuitry is replenished by the drain node of the cascode circuitry, a current pulse generated at the drain of the cascode circuitry based on the injected charge. The inclusion of capacitor circuitry within the DAC circuitry, provides a DAC circuitry that generates current pulses that have a width that is independent of the control signals (e.g., data signals). Thus, the DAC circuitry is able to use current pulse widths that are below the maximum data signal frequency, and has a higher bandwidth.

While the foregoing is directed to specific examples, other and further examples may be devised without departing from the basic scope thereof, and the scope thereof is determined by the claims that follow.

What is claimed is:

1. A unit cell circuitry for a digital-to-analog converter (DAC) circuitry, the unit cell circuitry comprising:

cascode circuitry connected to a first output node and a second output node of the unit cell circuitry;

switch circuitry connected to the cascode circuitry; and capacitor circuitry comprising one or more capacitors connected to the switch circuitry, wherein the switch circuitry is configured to connect the capacitor circuitry to the cascode circuitry to inject a charge onto the cascode circuitry, and wherein the unit cell circuitry is configured to output a signal based on the injected charge.

2. The unit cell circuitry of claim 1, wherein the capacitor circuitry comprises one or more switches connected to the one or more capacitors, wherein the one or more switches are configured to pre-charge the one or more capacitors.

3. The unit cell circuitry of claim 1, wherein the cascode circuitry comprises:

a first transistor comprising a drain node connected to the first output node and a source node connected to a first node of the unit cell circuitry; and a second transistor comprising a drain node connected to the second output node and a source node connected to a second node of the unit cell circuitry, wherein the one or more capacitors is connected to the first node and the second node via the switching circuitry, and is configured to inject the charge onto the source node of the first transistor via the first node and the source node of the second transistor via the second node.

4. The unit cell circuitry of claim 3, wherein the cascode circuitry comprises:

a third transistor comprising a drain node connected to the first output node and a source node connected to a third node of the unit cell circuitry; and a fourth transistor comprising a drain node connected to the second output node and a source node connected to a fourth node of the unit cell circuitry, wherein the one or more capacitors is further connected to the third node and the fourth node via the switching circuitry, and is configured to inject the charge onto the source node of the third transistor via the third node and the source node of the fourth transistor via the fourth node.

5. The unit cell circuitry of claim 4, wherein the one or more capacitors are connected between at least one of the first and the fourth node and the second and third node, and wherein the one or more capacitors are configured to transfer charge between the first node and the fourth node or between the second node and the third node depending on a value of a control signal.

6. The unit cell circuitry of claim 5, wherein the one or more capacitors is connected to the first node and the fourth node and disconnected from the second node and the third node via the switching circuitry based on a control signal having a first value, and the one or more capacitors is connected to the second node and the third node and disconnected from the first node and the fourth node via the switching circuitry based on the control signal having a second value.

7. The unit cell circuitry of claim 5, wherein the control signal corresponds to a value of a bit which depends on an input data signal.

8. The unit cell circuitry of claim 5, wherein the first node is connected to the second node via a fifth transistor, and the third node is connected to the fourth node via a sixth transistor, and wherein the fifth transistor and sixth transistor are configured to reset the first transistor, the second transistor, the third transistor, and the fourth transistor.

9. The unit cell circuitry of claim 1, wherein a charge of the one or more capacitors is adjusted based on a control signal.

10. A digital-to-analog converter (DAC) circuitry comprising:

unit cell circuitries comprising outputs that are connected to a load, wherein a first unit cell circuitry of the unit cell circuitries comprises:

cascode circuitry connected to a first output node and a second output node of the unit cell circuitry;

switch circuitry connected to the cascode circuitry; and capacitor circuitry comprising one or more capacitors connected to the switch circuitry, wherein the switch circuitry is configured to connect the capacitor circuitry to the cascode circuitry to inject a charge onto the cascode circuitry, and wherein the unit cell circuitry is configured to output a signal based on the injected charge.

11. The DAC circuitry of claim 10, wherein the capacitor circuitry comprises one or more switches connected to the one or more capacitors, wherein the one or more switches are configured to pre-charge the one or more capacitors.

12. The DAC circuitry of claim 11, wherein the cascode circuitry comprises:

a first transistor comprising a drain node connected to the first output node and a source node connected to a first node of the first unit cell circuitry; and a second transistor comprising a drain node connected to the second output node and a source node connected to a second node of the first unit cell circuitry, wherein the one or more capacitors is connected to the first node and the second node via the switching circuitry, and is configured to inject the charge onto the source node of the first transistor via the first node and the source node of the second transistor via the second node.

13. The DAC circuitry of claim 12, wherein the cascode circuitry comprises:

a third transistor comprising a drain node connected to the first output node and a source node connected to a third node of the first unit cell circuitry; and a fourth transistor comprising a drain node connected to the second output node and a source node connected to a fourth node of the first unit cell circuitry, wherein the one or more capacitors is further connected to the third node and the fourth node via the switching circuitry, and is configured to inject the charge onto the source node of the third transistor via the third node and the source node of the fourth transistor via the fourth node.

14. The DAC circuitry of claim 13, wherein the one or more capacitors are connected between at least one of the first and the fourth node and the second and third node, and wherein the one or more capacitors are configured to transfer charge between the first node and the fourth node or between the second node and the third node depending on a value of a control signal.

15. The DAC circuitry of claim 14, wherein the one or more capacitors is connected to the first node and the fourth node and disconnected from the second node and the third node via the switching circuitry based on a control signal having a first value, and the one or more capacitors is connected to the second node and the third node and disconnected from the first node and the fourth node via the switching circuitry based on the control signal having a second value.

16. The DAC circuitry of claim 14, wherein the control signal corresponds to a value of a bit which depends on an input data signal.

17. The DAC circuitry of claim 14, wherein the first node is connected to the second node via a fifth transistor, and the third node is connected to the fourth node via a sixth transistor, and wherein the fifth transistor and sixth transistor are configured to reset the first transistor, the second transistor, the third transistor, and the fourth transistor.

18. The DAC circuitry of claim 10, wherein a charge of the one or more capacitors is adjusted based on a control signal.

19. The DAC circuitry of claim 10, wherein at least two of the unit cell circuitries are interleaved with each other.

20. A computer system comprising:

processing circuitry configured to process a signal in an analog domain; and digital-to-analog converter (DAC) circuitry having an output connected to the processing circuitry, and configured to convert an input signal from a digital domain to the analog domain, the DAC circuitry comprising:

unit cell circuitry comprising:

cascode circuitry connected to a first output node and a second output node of the unit cell circuitry;

switch circuitry connected to the cascode circuitry; and capacitor circuitry comprising one or more capacitors connected to the switch circuitry, wherein the switch circuitry is configured to connect the capacitor circuitry to the cascode circuitry to inject a charge onto the cascode circuitry, and wherein the unit cell circuitry is configured to output a signal based on the injected charge.

* * * * *